United States Patent
Przybysz et al.

(10) Patent No.: US 12,426,504 B2
(45) Date of Patent: Sep. 23, 2025

(54) SOLID-STATE COOLER DEVICE WITH GRID POINT CONTACTS

(71) Applicant: NORTHROP GRUMMAN SYSTEMS CORPORATION, Falls Church, VA (US)

(72) Inventors: John X. Przybysz, Severna Park, MD (US); Aaron Ashley Hathaway, Baltimore, MD (US); Edward R. Engbrecht, Odenton, MD (US); Robert M. Young, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/363,450

(22) Filed: Aug. 1, 2023

(65) Prior Publication Data
US 2025/0048930 A1    Feb. 6, 2025

(51) Int. Cl.
*H10N 10/17*    (2023.01)
*F25B 21/02*    (2006.01)
*H10N 10/01*    (2023.01)
*H10N 10/855*    (2023.01)

(52) U.S. Cl.
CPC ............. *H10N 10/17* (2023.02); *F25B 21/02* (2013.01); *H10N 10/01* (2023.02); *H10N 10/8552* (2023.02)

(58) Field of Classification Search
CPC .... H10N 10/17; H10N 10/8552; H10N 10/01; F25B 21/02
See application file for complete search history.

(56) References Cited

U.S. PATENT DOCUMENTS

| | | | |
|---|---|---|---|
| 5,634,718 A * | 6/1997 | Martinis | G01K 7/006 374/E7.003 |
| 6,581,387 B1 * | 6/2003 | Ullom | H10N 60/10 62/3.1 |
| 10,998,485 B1 * | 5/2021 | Przybysz | H10N 60/0688 |
| 11,189,773 B2 | 11/2021 | Hathaway et al. | |
| 2019/0058005 A1 * | 2/2019 | Pesetski | H10N 60/815 |
| 2021/0063060 A1 * | 3/2021 | Young | H10N 60/82 |
| 2021/0066571 A1 * | 3/2021 | Hathaway | H10N 60/85 |
| 2021/0151653 A1 * | 5/2021 | Holmes | H10N 10/81 |
| 2021/0257533 A1 * | 8/2021 | Hathaway | H10N 60/0912 |

FOREIGN PATENT DOCUMENTS

JP    2023505985 A    2/2023

OTHER PUBLICATIONS

WOISR: "Notification of Transmittal of the International Search Report and the Written Opionion of the International Searching Authority, or the Declaration" mialed on Jul. 17, 2025 for corresponding PCT/US2024/035883.

* cited by examiner

*Primary Examiner* — Sadie White
(74) *Attorney, Agent, or Firm* — Tarolli, Sundheim, Covell &Tummino LLP (57) ABSTRACT

A solid-state cooler device is disclosed that includes a first portion having a normal metal heat sink layer and a plurality of first parallel ridges disposed over the normal metal heat sink layer, and a second portion having a normal metal layer, insulator layer, superconductor layer (NIS) junction and a plurality of second parallel ridges disposed over the superconductor layer of the NIS junction. The plurality of first parallel ridges are in contact and orthogonal to the plurality of second parallel ridges to provide a plurality of grid point contacts.

14 Claims, 5 Drawing Sheets

SOLID-STATE COOLER DEVICE WITH GRID POINT CONTACTS

TECHNICAL FIELD

The present invention relates generally to refrigeration, and more particularly to a solid-state cooler device with grid point contacts.

BACKGROUND

Solid-state electron cooling by the tunneling of "hot" electrons across a normal metal-insulator-superconductor (NIS) junction, using a bias voltage, has been proven to work below 1K, substantially operating like the more familiar near room-temperature expensive Peltier thermo-electric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold-sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction. However, phonon heat generated in the quasiparticle trap can migrate back to the superconducting electrodes also limiting the temperature difference between the hot side and cold-sides of the NISN junction solid-state cooler.

SUMMARY

In one example, a solid-state cooler device is disclosed that comprise a first portion having a normal metal heat sink layer and a plurality of first parallel ridges disposed over the normal metal heat sink layer, and a second portion having a normal metal layer, insulator layer, superconductor layer (NIS) junction and a plurality of second parallel ridges disposed over the superconductor layer of the NIS junction. The plurality of first parallel ridges are in contact and orthogonal to the plurality of second parallel ridges to provide a plurality of grid point contacts.

In another example, a refrigeration system is disclosed that comprises a refrigeration container formed from one or more plates, and a plurality of solid-state cooler devices surrounding the outside of the refrigeration container. Each of the solid-state cooler devices comprises a first portion having a normal metal heat sink layer, a superconductor interface layer disposed on the normal metal heat sink layer, and a plurality of first parallel superconductor ridges disposed over the superconductor interface layer. Each of the solid-state cooler devices further comprises a second portion having a normal metal layer, insulator layer, superconductor layer (NIS) junction and a plurality of second parallel superconductor ridges disposed over the superconductor layer of the NIS junction, wherein the plurality of first parallel superconductor ridges are in contact and orthogonal to the plurality of second parallel superconductor ridges to provide a plurality of grid point contacts that provide paths for quasiparticles to move from the normal metal layer of the NIS junction to the normal metal heat sink layer in response to a critical current that flows across the NIS junction.

In yet another example, a method of forming a solid-state cooler device is disclosed. The method comprises fabricating a first chip comprising forming an interface layer over a normal metal heat sink layer, and forming a plurality of first parallel ridges disposed over the interface layer. The method further comprises fabricating a second chip comprising forming a normal metal, insulator, superconductor (NIS) junction and forming a plurality of second parallel ridges disposed over the superconductor layer of the NIS junction. The second chip is flip chip bonded onto the first chip with the plurality of first parallel ridges being in contact and orthogonal to the plurality of second parallel ridges to provide a plurality of grid point contacts that provide paths for quasiparticles to move from the normal metal layer of the NIS junction to the normal metal heat sink layer in response to a critical current that flows across the NIS junction.

DETAILED DESCRIPTION

The disclosure relates to a solid-state point cooler device and a refrigeration system including a refrigeration container defined by refrigeration plates and a plurality of solid-state cooler devices disposed around the refrigeration plate or plates. The solid-state point cooler devices can form a last refrigeration stage in a plurality of refrigeration stages to provide cooling down to milliKelvin temperatures. The solid-state point cooler is formed of a cold-side portion (or cold-side chip) that has a normal metal-insulator-superconductor (NIS) junction having a plurality of first parallel ridges, and a warm-side portion (or warm-side chip) that has a normal metal heat sink portion that has a plurality of second parallel ridges. The plurality of first parallel ridges are in contact and orthogonal to the plurality of second parallel ridges to form a plurality of grid point contacts between the NIS junction portion and the normal metal heat sink portion. A normal metal is a metal that does not superconduct at a given cryogenic operational device temperature.

Point coolers are a new class of solid-state coolers based on Normal/Insulator/Superconductor (NIS) tunnel junctions. One example of point coolers can be found in commonly owned U.S. Pat. No. 11,333,413, entitled "Solid-state Cooler Device", the entire contents of which is incorporated herein. Point coolers use two chips (or portion) connected by small points of contact. The cold-side chip contains an NIS cooler junction and is in contact with the cooled payload. The warm-side chip contains the heat sink (or quasiparticle trap). It rejects waste heat to another refrigerator that provides the next stage of cooling.

It is appreciated that a large area geometry contact between the superconductor of the NIS junction and the coupled normal metal heat sink allows hot phonons to leak back into the superconductor and normal metal layer of the NIS junction, greatly limiting performance of the solid-state cooler device. The altering of the geometry and reduction of the contact area by employing grid contacts utilizes the thermal boundary resistance (TBR) that exists between the superconductor layer and the normal metal heat sink, and thus reduces the backwards leakage of heat from the normal metal heat sink back to the superconductor layer of the NIS junction. This allows the rejection temperature to be raised beyond conventional NIS or NISN coolers by reducing the backward leakage of heat from the hot rejection side while not impeding the heat lifting of quasi-particles when the normal metal heat sink functions as a quasi-particle trap.

The present disclosure provides a structure and method to fabricate point coolers employing narrow parallel ridges disposed on both the warm-side chip and the cold-side chip bonded together as orthogonal lines in a criss-cross pattern. When pressed together and bonded, the criss-cross ridges form a grid of small area grid point contacts that are closely spaced. The grid point contacts provide a short path for the diffusion of hot quasiparticles from the cold-side chip to the warm-side chip. The tight pattern of grid point contacts ensures a short diffusion path length for hot quasiparticles to efficiently conduct the waste heat from the cold payload side to the warm-side heat sink.

Parallel ridges are an improvement on bump bonds because a smaller ridge feature at a smaller pitch can be patterned than standard lift off processes, which generally work best for large metal features. The point cooler device takes advantage of the different nature and function of point cooler grid point contacts compared to integrated circuit flip chip bonds. All point cooler grid point contacts work in parallel to carry the quasiparticles from the cold-side chip to the warm-side chip. There is no requirement to connect particular points on the cold-side to exact locations on the warm-side since any contact forms a grid point contact.

The present disclosure enables a finer grid of contacts to be formed with the same fabrication tools utilized to form bump bonds. In certain foundries, bump bonds can be limited to 1-μm bumps on a 10-μm grid when using a metal lift off deposition process. In one example, criss-cross ridges can be etched as 0.25-μm contacts on a 2.5-μm grid. For example, 0.25-μm aluminum (Al) ridges can be dry etched on any pitch greater than 0.5-μm. This tighter pitch of a dry etched ridge can increase the overall chip bonding contact area, and therefore the bond shear strength, since more of the junction area can be efficiently utilized.

The solid-state point cooler can be configured to lift the waste heat to a higher rejection temperature than when using bump bonds. At higher rejection temperatures, the increased density of thermally activated quasiparticles (QPs) shortens the quasiparticle diffusion decay length. Decaying QPs deposit waste heat in the cold-side, degrading cooler performance. Short diffusion paths reduce QP decay in the cold-side, so the cooler can operate efficiently at higher heat sink temperatures.

The point cooler with grid point contacts is meant to cool solid bodies to operating temperatures below 2 Kelvin (K). The point cooler with grid point contacts uses materials and processes that are established and compatible with silicon CMOS equipment employing materials, such as tungsten (W), titanium tungsten (TiW), aluminum (Al), niobium (Nb), and Nb/aluminum oxide (AlOx)/Al tunnel junctions. The point cooler with grid point contacts can provide continuous cooling when a DC bias current of a few amps is applied across a single, large tunnel junction, and provide tens of microwatts of heat lift in a compact 1 square centimeter assembly. Ten thousand of these point coolers with grid point contacts can be placed between or on one or more of two copper sheets of a last stage of a refrigeration system, and cover approximately 1 square meter area to provide large heat lift at 50 mK.

The point cooler can be formed with various normal metal materials and superconductor materials. The normal metals can be selected from materials, such as gold (Au), platinum (Pt), tungsten (W), titanium tungsten (TiW), copper (Cu), a doped superconductor material, or a metal that is above its superconducting transition temperature, such as titanium or chromium, or a combination thereof. The superconductor materials can be selected from materials, such as indium (In), niobium (Nb), aluminum (Al), titanium (Ti), tin (Sn), molybdenum (Mo) or some other superconductor material that is doped or undoped.

The point cooler with grid point contacts provides a solid-state alternative to conventional dilution refrigerators based on expensive helium-3. This also provides an alternative to adiabatic demagnetization refrigerators (ADRs). The point cooler with grid point contacts can provide continuous cooling power as long as a DC current is applied to the NIS tunnel junction. ADRs have a single shot operation. An ADR cools until the fixed capacity of the cooling salts have been exhausted, then an ADR requires another warming and cooling cycle.

Figure 1:
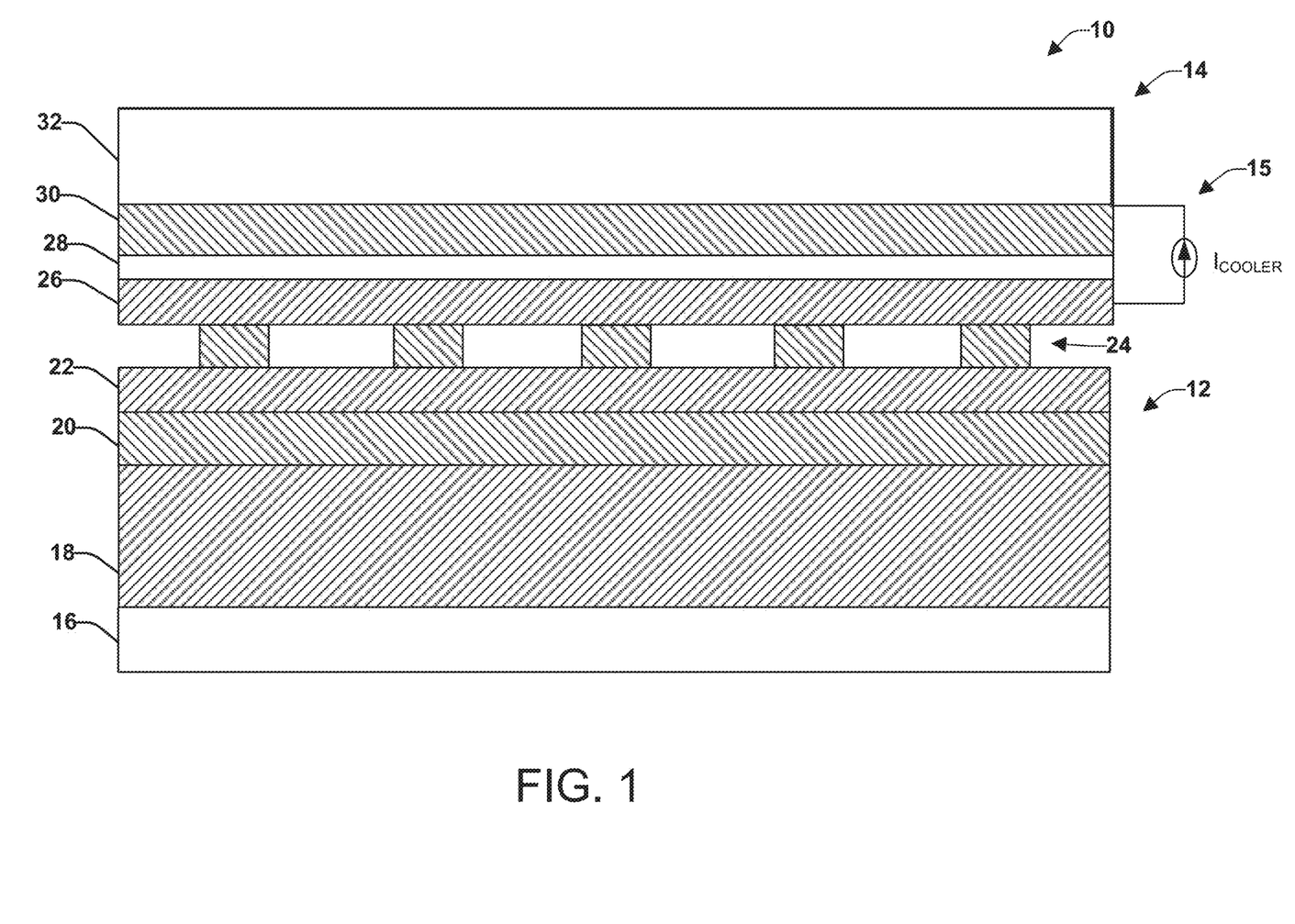
FIG. 1 illustrates a cross-sectional view of an example of a solid-state point cooler device.

FIG. 1 illustrates a cross-sectional view of an example of a solid-state point cooler device 10. The solid-state point cooler device 10 can be configured as a refrigeration stage employed in a cryogenic cooling application in which the solid-state structure is one of a plurality of solid-state cooler devices placed around a refrigeration container that resides in a vacuum and holds superconducting circuitry. The plurality of solid-state structures can provide the final stage in a cryogenic refrigeration system, and allow for efficient cooling by removal of heat from a cold-side of the refrigeration stage, and prevent the return of heat from the warm-side of the last refrigeration stage within a plurality of refrigeration stages.

The solid-state point cooler device includes a cold-side portion 14 and a warm-side portion 12. The warm-side portion 12 includes a normal metal heat sink layer 18 overlying a silicon layer or substrate 16, an interface layer 20 overlying the normal heat sink layer 18 and a plurality of first parallel superconductor ridges 22 that are spaced about from one another and overly the interface layer 20. The plurality of first parallel ridges 22 are disposed over the interface layer 20 and spaced apart from one another generally at equal distances between one another. The plurality of first parallel superconductor ridges 22 can be about 50 nm to about 500 nm wide (e.g., about 250 nm wide) and spaced apart from one another by about 1 µm to about 5 µm spaces (e.g., about 2.5-µm spaces). The interface layer 20 can be formed of a superconductor material or a normal metal material and provides a large contact area for the quasiparticles to spread out and enter the normal metal heat sink layer 18.

Figure 7:
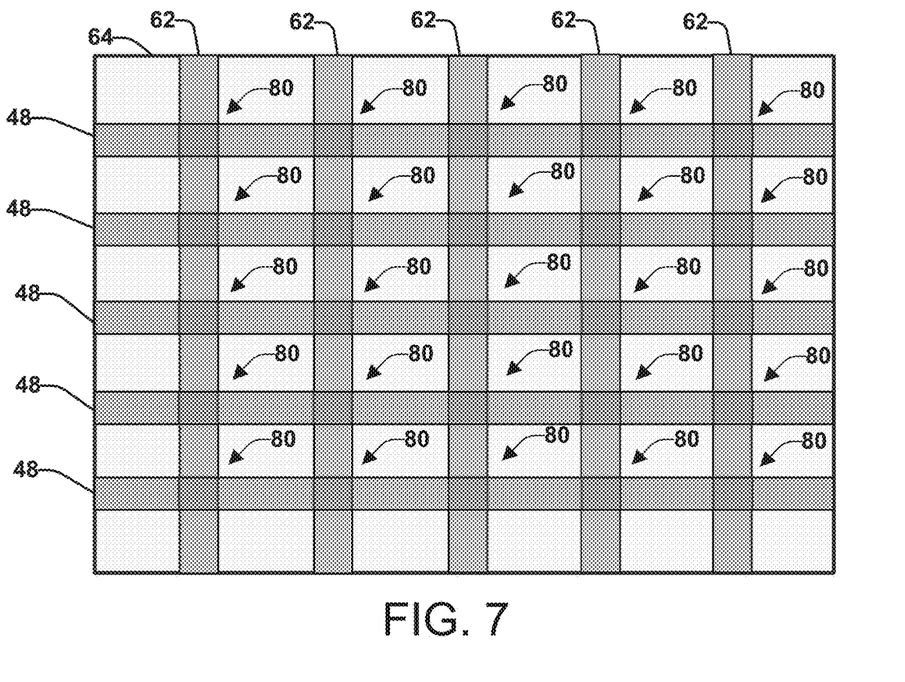
FIG. 7 illustrates a cross-sectional view of the solid-state cooler after bonding along lines C-C of FIG. 6.

The cold-side portion 14 includes an NIS junction 15 disposed on a silicon layer or silicon substrate 32. The NIS junction 15 includes a normal metal layer 30, an insulator layer 28 disposed on the normal metal layer 30 and a superconductor layer 26 disposed on the insulator layer 28. A plurality of second parallel superconductor ridges 24 are disposed on the superconductor layer 26, and spaced apart from one another generally at equal distances between one another. The plurality of second parallel superconductor ridges 26 can be about 50 nm to about 500 nm wide (e.g., about 250 nm wide) and spaced apart from one another by about 1 µm to about 5 µm spaces (e.g., about 2.5-µm spaces). The plurality of second parallel superconductor ridges 24 are bonded to the plurality of first superconductor ridges in, for example, a vacuum bonder, with the plurality of second parallel superconductor ridges 24 and the plurality of first parallel superconductor ridges 22 running orthogonal to one another to form a plurality of grid point contacts (see 80 of FIG. 7).

In one example, a cooler current ($I_{COOLER}$) can be injected to flow through the NIS junction to cool the normal metal to 100 mK as hot electrons tunnel into the superconductor. The injected quasiparticles diffuse through the points of contact between the ridges. In one example, the total contact area between warm-side portion and cold-side portion can be less than 1% of the chip area of both the warm-side portion and the cold-side portion. Smaller contacts enable closer contacts, to shorten the path from the point of quasiparticle injection on the cold-side to the heat sink on the warm-side. The return of heat extracted from the cold-side of the solid-state point cooler device is mitigated by a reduction of the warm-side and cold-side contact area through the plurality of grid point contacts.

In one example, multiple different superconductor materials can be employed to form two or more of the superconductor layer 26, the plurality of second parallel ridges 24, the plurality of first parallel superconductor ridges 22 and the interface layer 20. The multiple different superconductor materials can be selected to have energy bandgaps that go from higher energy bandgaps to lower energy bandgaps through the quasiparticle path as the quasiparticles moves through the NIS junction to the normal metal heat sink layer. For example, the superconductor layer 26 and the plurality of second parallel ridges 24 can be formed of a first superconductor material with a first energy bandgap, the plurality of first parallel ridges 22 can be formed of a second superconductor material with a second energy bandgap and the interface layer 20 can be formed of a third superconductor material with a third energy bandgap. The first energy bandgap is greater than the second energy bandgap, and the second energy bandgap is greater than the third energy bandgap.

In another example, the superconductor layer 26 can be formed of a first superconductor material, the plurality of second parallel ridges 24 can be formed of the second superconductor material, the plurality of first parallel ridges 22, and the interface layer 20 can be formed of a third superconductor material. In yet a further example, the superconductor layer 26 and the plurality of second parallel ridges 24 can be formed of a first superconductor material, and the plurality of first parallel ridges 22, and the interface layer 20 can be formed of a second superconductor material with the energy bandgap of the first superconductor material being greater than the energy bandgap of the first superconductor material. The types of selected superconductor material can vary based achieving the desired cascading energy bandgaps. Some of these materials of varying cascading bandgaps can be found in commonly owned U.S. Pat. No. 11,189,773 entitled, "Superconductor Thermal Filter", the entire contents of which is incorporated herein.

In one example, the first superconductor material is formed of niobium (Nb) with a superconducting energy bandgap of $2\Delta=30.5\times10^{-4}$ eV, the second superconductor material is formed of tin (Sn) with a superconducting energy bandgap of $2\Delta=11.5\times10^{-4}$ eV, and the third superconductor material is formed of aluminum (Al) with a superconducting energy bandgap of $2\Delta=3.4\times10^{-4}$ eV. In yet another example, the first superconductor material is formed of aluminum (Al) with a superconducting energy bandgap of $2\Delta=3.4\times10^{-4}$ eV, the second superconductor material is formed of molybdenum (Mo) with a superconducting energy bandgap of $2\Delta=2.7\times10^{-4}$ eV, and the third superconductor material is formed of titanium (Ti) with a superconducting energy bandgap of $2\Delta=1.2\times10^{-4}$ eV. It is to be appreciated that a variety of different superconducting materials could be employed as long as they are selected to having progressinginly decreasing superconducting energy bandgaps from the normal metal layer 30 to the normal metal layer heat sink 18.

Figure 2:
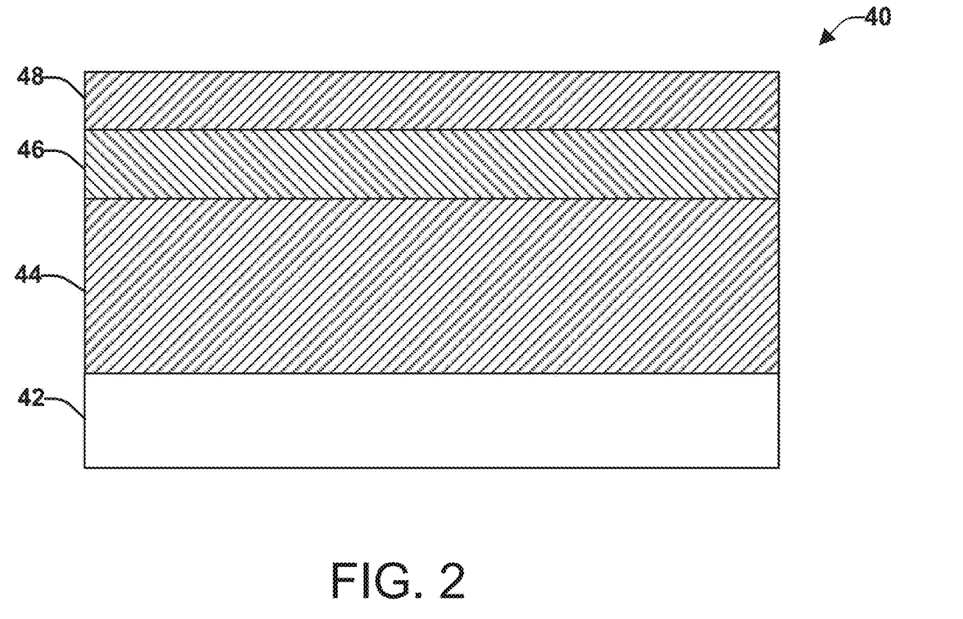
FIG. 2 illustrates a cross-sectional view of an example of a warm-side portion or chip of a solid-state point cooler.
Figure 3:
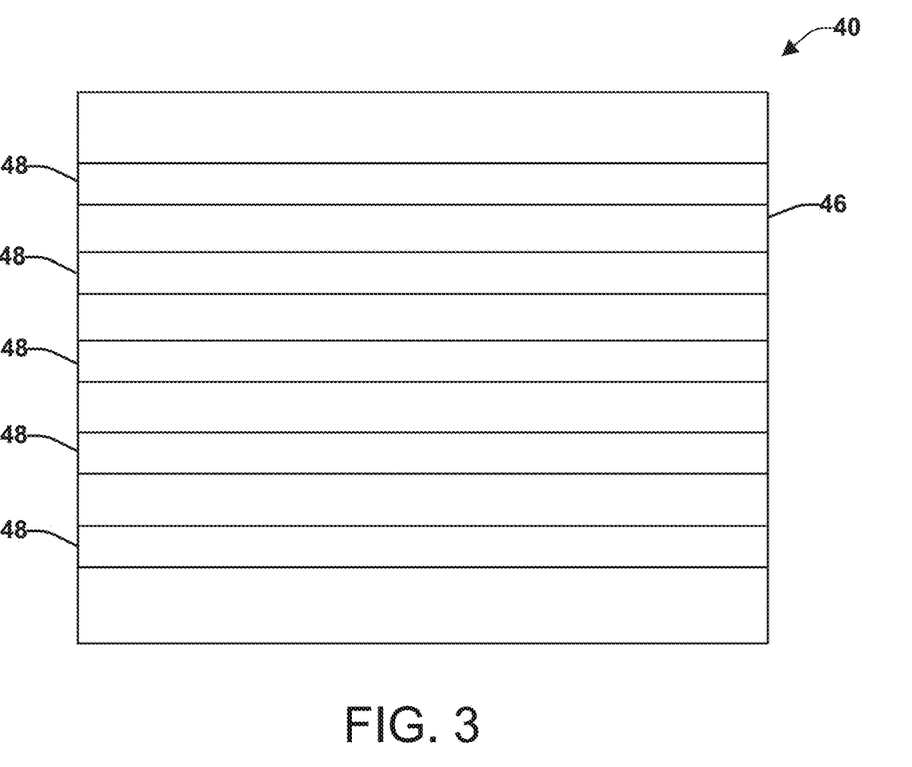
FIG. 3 illustrates a plan view of the warm-side portion or chip of FIG. 2.

FIG. 2 illustrates a cross-sectional view of an example of a warm-side portion or chip 40 of a solid-state point cooler. FIG. 3 illustrates a plan view of the warm-side portion or chip 40 of FIG. 2. The warm-side portion 40 includes a normal metal heat sink layer 44 disposed on a silicon layer or substrate 42, an interface layer 46 disposed on the normal heat sink layer 44 and a plurality of first parallel ridges 48 that are spaced about from one another and disposed on the interface layer 46. The plurality of first parallel ridges 48 are disposed on the interface layer 46 and spaced apart from one another generally at equal distances between one another as discussed in FIG. 1. The plurality of first parallel ridges 48 can be formed of a superconductor material or a normal metal. The interface layer 46 can be formed of a superconductor material or a normal metal material and provides a large contact area for the quasiparticles to spread out and enter the plurality of first parallel ridges 48.

In one example, the plurality of first parallel ridges 48 and the interface layer 46 are formed of a same superconductor material. In another example, the plurality of first parallel ridges 48 and the interface layer 46 are formed of a different superconductor material with the interface layer 46 being made of a superconductor material that has a lower bandgap than the plurality of first parallel ridges 48. In yet another example, the plurality of first parallel ridges 48 are made of a superconductor material layer and the interface layer 46 is formed of a normal metal layer that is different than the normal metal that forms the normal metal heat sink layer 44. In yet another further example, the plurality of first parallel ridges 48 are disposed directly on the normal metal heat sink layer 44 and the interface layer 46 is eliminated.

The plurality of first parallel ridges 48 can be formed by depositing a superconductor material or a normal metal layer over the normal metal heat sink layer 44, forming a photoresist pattern over the superconductor material or normal metal with a pattern that protects ridge patterns, and partially etching the superconductor material layer to leave the plurality of first parallel ridges 48, and removing the photoresist layer to provide the plurality of first ridges 48 and the interface layer 46 below the plurality of first parallel ridges 48. In another example, the plurality of first parallel ridges 48 and the interface layer 46 are formed of a different material. In this alternate example, the plurality of first parallel ridges 48 can be formed by depositing a superconductor material or a normal metal layer over the normal metal heat sink layer 44 to form the interface layer 46, forming a photoresist pattern over the superconductor material or normal metal with ridge pattern openings, depositing a second material different than the material that forms the interface layer 46 over the photoresist material, and performing a lift-off process of the photoresist material and the excess second material to leave the plurality of first parallel ridges 48 over the interface layer 46.

Figure 4:
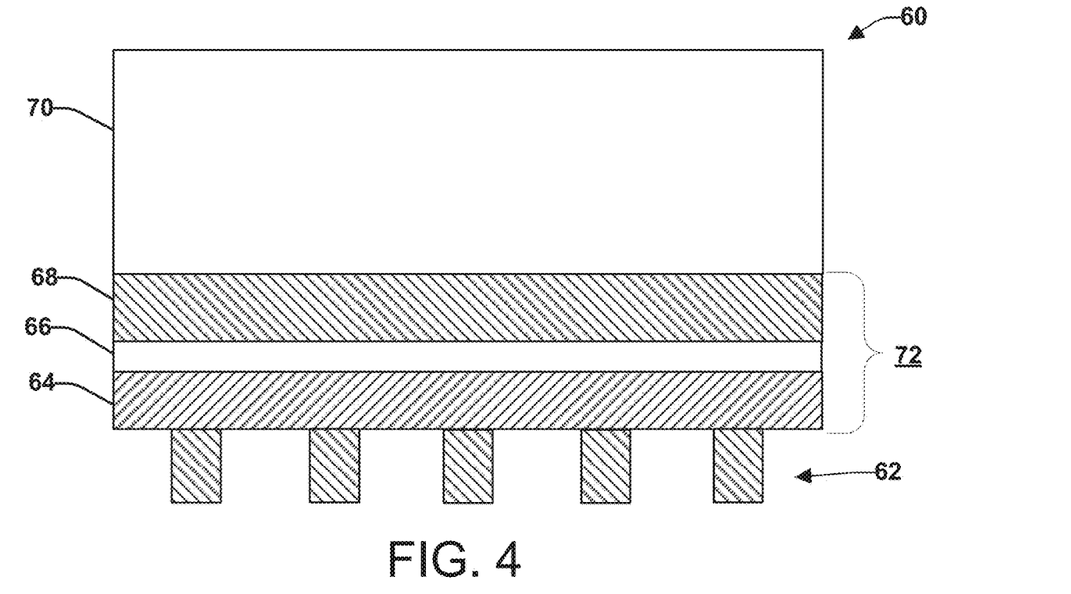
FIG. 4 illustrates a cross-sectional view of an example of a cold-side portion or chip of a solid-state point cooler.
Figure 5:
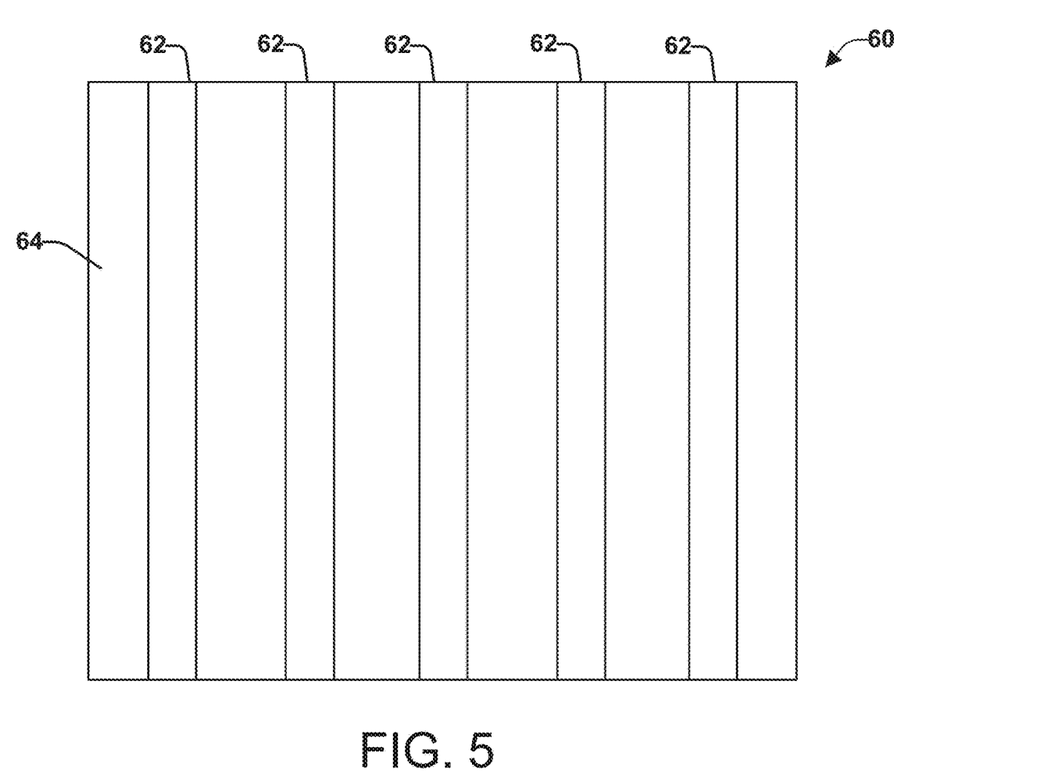
FIG. 5 illustrates a plan view of the cold-side portion or chip of FIG. 4.

FIG. 4 illustrates a cross-sectional view of an example of a cold-side portion or chip 60 of a solid-state point cooler. FIG. 5 illustrates a plan view of the cold-side portion or chip 60 of FIG. 4. The cold-side portion 60 includes a NIS junction 72 disposed on a silicon layer or silicon substrate 70. The NIS junction 72 includes a normal metal layer 68, and insulator layer 66 disposed on the normal metal layer 68 and a superconductor layer 64 disposed on the insulator layer 66. A plurality of second parallel ridges 62 are disposed on the superconductor layer 64, and spaced apart from one another generally at equal distances between one another. The plurality of second parallel ridges 62 can be formed of a superconductor material or a normal metal material.

In one example, the plurality of second parallel ridges 62 and the superconductor layer 64 are formed of a same material. In this example, the plurality of second parallel ridges 62 can be formed by partially etching a superconductor material layer that is disposed on the insulator layer 66. For example, a superconductor layer can be deposited, a photoresist pattern formed over the superconductor material with a pattern that protects ridge patterns, and partially etching the superconductor material layer to leave the plurality of second parallel ridges 62, and removing the photoresist layer to provide the plurality of second parallel ridges 62 disposed on the superconductor layer 62.

In another example, the plurality of second parallel ridges 62 and the superconductor layer 64 are formed of a different material. In this alternate example, the plurality of second parallel ridges 62 can be formed by depositing a superconductor material or a normal metal layer over the superconductor layer 64, forming a photoresist pattern over the superconductor material or normal metal with ridge pattern openings, depositing a second material different than the superconductor material that forms the plurality of second parallel ridges 62 over the photoresist material, and performing a lift-off process of the photoresist material and the excess second material to leave the plurality of second parallel ridges 62 over the superconductor layer 64.

Figure 6:
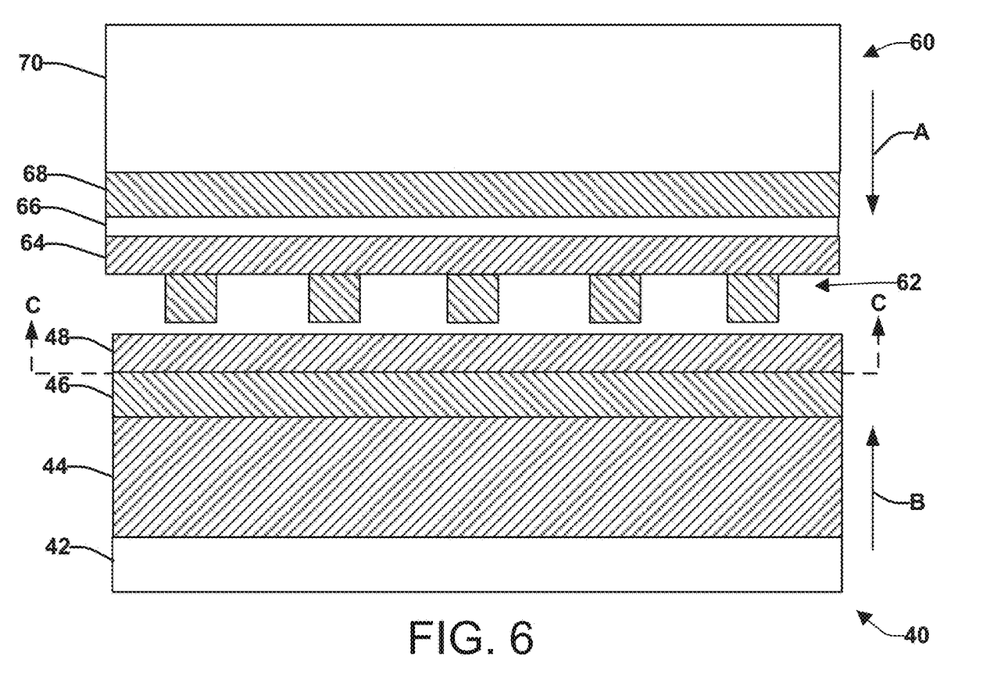
FIG. 6 illustrates the cold-side portion or chip overlying the warm-side portion or chip for bonding via a flip chip vacuum bonding process to form a solid-state point cooler.

FIG. 6 illustrates the cold-side portion or chip 60 overlying the warm-side portion or chip 40 for bonding a flip chip vacuum bonding process to form a solid-state point cooler. The plurality of second parallel ridges 62 are aligned and oriented orthogonal to the plurality of first parallel ridges 48. The cold-side portion 60 is moved along arrow A and/or the warm-side portion 40 is moved along arrow B to engage the plurality of first parallel ridges 48 with the plurality of second parallel ridges 62 to bond the cold portion 60 with the warm-side portion 40 at a plurality of grid point contacts 80 shown in the cross-sectional view along lines C-C of FIG. 6 illustrated in FIG. 7. Even though the grid point contacts 80 are small and tightly spaced, they have a large tolerance for misalignment during bonding. All of the grid point contacts perform the same function, without regard to particular locations from one chip to the other. Short diffusion paths are important to minimize the amount of quasiparticle decay during diffusion. The quasiparticles carry the waste heat of the cooler to the normal metal heat sink layer 44. Quasiparticle decay can leak waste heat into the cold-side portion 60. The solid-state point cooler exploits this translational invariance of functionality to build a grid of fine, closely-spaced point contacts using existing toolsets.

Figure 8:
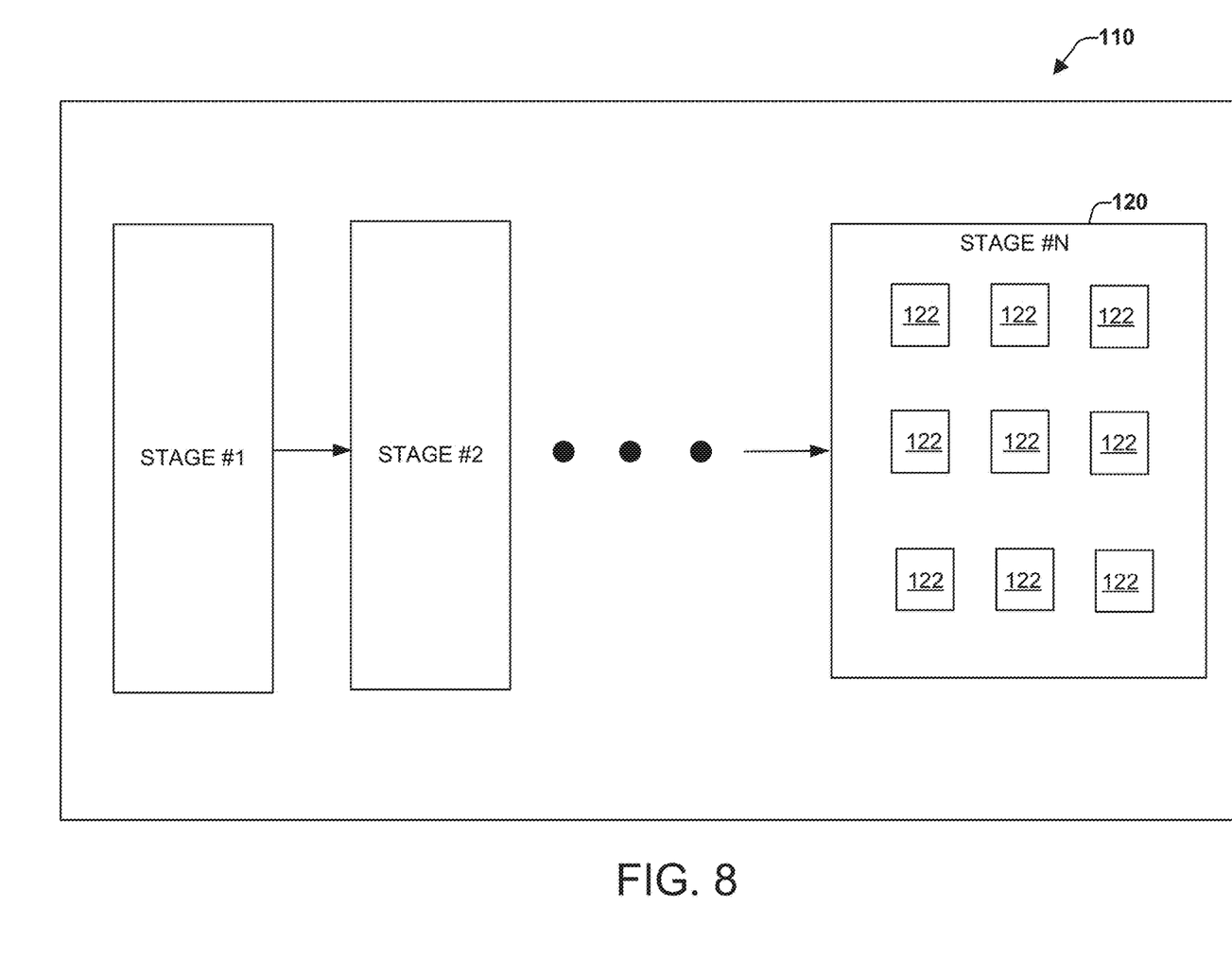
FIG. 8 illustrates a block diagram of a refrigeration system that employs solid-state devices such as the solid-state device of FIG. 1

FIG. 8 illustrates a block diagram of a refrigeration system 110 that employs solid-state devices such as the solid-state device 10 of FIG. 1. The refrigeration system 110 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 110. In other examples, the Nth stage is a first or intermediary stage as opposed to the last stage. Stage #N in the refrigeration system 110 includes a refrigeration container 120 formed of one or more refrigeration plates with a plurality of solid-state devices 122 similar to that illustrated in FIG. 1 surrounding the container and cooperating to provide the final lowest temperature of the refrigeration system 110 within the container 120. The container 120 can be in a vacuum environment and be configured to house superconducting circuitry. In another example, one or more of the other stages employ solid-state devices similar to those in stage #N to provide incremental temperature drops across the refrigeration system 110. In other examples, the refrigeration container 120 and/or refrigeration plates can be formed of a normal metal that provides the final normal metal layer of each solid-state device 122.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A solid-state cooler device comprising:
a first portion having a normal metal heat sink layer and a plurality of first elongated parallel ridges disposed over the normal metal heat sink layer, the plurality of first elongated parallel ridges extending from one edge to an opposite edge of the normal metal heat sink layer; and
a second portion disposed over the first portion, the second portion having an NIS junction comprising a normal metal layer, an insulator layer and, a superconductor layer and a plurality of second elongated parallel ridges disposed over the superconductor layer of the NIS junction, the plurality of second elongated parallel ridges extending from one edge to an opposite edge of the superconductor layer, wherein the plurality of first elongated parallel ridges are in contact and orthogonal to the plurality of second elongated parallel ridges to provide a plurality of grid point contacts.

2. The solid-state cooler device of claim 1, wherein the solid-state cooler device is configured to move quasiparticles from the from the normal metal layer of the NIS junction to the normal metal heat sink layer in response to a current that flows across the NIS junction.

3. The solid-state cooler device of claim 2, further comprising an interface layer disposed between the plurality of first elongated parallel ridges and the normal metal heat sink layer, the interface layer providing a large contact area for the quasiparticles to spread out and enter the normal metal heat sink layer.

4. The solid-state cooler device of claim 3, wherein the interface layer is formed of the same material as the plurality of first elongated parallel ridges.

5. The solid-state cooler device of claim 3, wherein two or more of the materials that form the superconductor material layer of the NIS junction, the plurality of second elongated parallel ridges, the plurality of first elongated parallel ridges and the interface layer are formed of different superconductor materials that have progressively decreasing superconducting energy bandgaps from the superconductor material layer of the NIS junction to the interface layer.

6. The solid-state cooler device of claim 1, wherein the plurality of first elongated parallel ridges are formed of one of superconductor materials and a metal contacting a trap and the plurality of second elongated parallel ridges are formed of superconductor materials.

7. The solid-state cooler device of claim 1, wherein the plurality of first elongated parallel ridges are about 50 nm to about 500 nm wide and spaced apart from one another by about 1 µm to about 5 µm spaces, and the plurality of second elongated parallel ridges are about 50 nm to about 500 nm wide and spaced apart from one another by about 1 µm to about 5 µm spaces.

8. The solid-state cooler device of claim 1, wherein the total contact area of the plurality of grid point contacts is less than 1% of the area of the superconductor layer of the NIS junction and the area of the normal metal heat sink layer.

9. The solid-state cooler device of claim 1, wherein normal metal materials of the solid-state cooler are selected from the group comprising gold (Au), platinum (Pt), tungsten (W), titanium tungsten (TiW), copper (Cu), titanium (Ti) and chromium (Cr), and wherein superconductor materials of the solid-state cooler are selected from the group comprising indium (In), niobium (Nb), aluminum (Al), titanium (Ti), tin (Sn), molybdenum (Mo), tantalum (Ta), Vanadium (v).

10. A refrigeration system comprising a plurality of refrigeration stages, wherein a last stage comprises a refrigeration container formed from one or more plates and a plurality of solid-state cooler devices as claimed in claim 1 disposed about the outside of the refrigeration container.

11. A refrigeration system comprising:
a refrigeration container formed from one or more plates;
a plurality of solid-state cooler devices surrounding the outside of the refrigeration container wherein each of the solid-state cooler devices comprises:
a first portion having a normal metal heat sink layer, a superconductor interface layer disposed on the normal metal heat sink layer, and a plurality of first elongated parallel superconductor ridges disposed over the superconductor interface layer, the plurality of first elongated parallel superconductor ridges extending from one edge to an opposite edge of the superconductor interface layer; and
a second portion disposed over the first portion, the second portion having an NIS junction comprising a normal metal layer, an insulator layer and, a superconductor layer and a plurality of second elongated parallel superconductor ridges disposed over the superconductor layer of the NIS junction, the plurality second elongated parallel superconductor ridges extending from one edge to an opposite edge of the superconductor layer,
wherein the plurality of first elongated parallel superconductor ridges are in contact and orthogonal to the plurality of second elongated parallel superconductor ridges to provide a plurality of grid point contacts that provide paths for quasiparticles to move from the normal metal layer of the NIS junction to the normal metal heat sink layer in response to a critical current that flows across the NIS junction.

12. The refrigeration system of claim 11, wherein two or more of the materials that form the superconductor material layer of the NIS junction, the plurality of second elongated parallel superconductor ridges, the plurality of first elongated parallel superconductor ridges and the interface layer are formed of different superconductor materials that have progressively decreasing superconducting energy bandgaps from the superconductor material layer of the NIS junction to the interface layer.

13. The refrigeration system of claim 11, wherein two or more of the materials that form the superconductor material layer of the NIS junction, the plurality of second elongated parallel superconductor ridges, the plurality of first elongated parallel superconductor ridges and the interface layer are formed of a normal metal in contact with a trap.

14. The refrigeration system of claim 11, wherein the plurality of first elongated parallel superconductor ridges are about 50 nm to about 500 nm wide and spaced apart from one another by about 1 µm to about 5 µm spaces, and the plurality of second elongated parallel superconductor ridges are about 50 nm to about 500 nm wide and spaced apart from one another by about 1 µm to about 5 µm spaces.

* * * * *